(12) United States Patent
Iga et al.

(10) Patent No.: US 12,129,570 B2
(45) Date of Patent: Oct. 29, 2024

(54) MANUFACTURING METHOD OF SINGLE-CRYSTAL SILICON SUBSTRATE

(71) Applicant: DISCO CORPORATION, Tokyo (JP)

(72) Inventors: Hayato Iga, Tokyo (JP); Shin Tabata, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 141 days.

(21) Appl. No.: 17/819,666

(22) Filed: Aug. 15, 2022

(65) Prior Publication Data

US 2023/0054939 A1 Feb. 23, 2023

(30) Foreign Application Priority Data

Aug. 18, 2021 (JP) ................. 2021-133117

(51) Int. Cl.
*C30B 33/06* (2006.01)
*C30B 29/06* (2006.01)
*C30B 29/64* (2006.01)
*C30B 30/00* (2006.01)

(52) U.S. Cl.
CPC .............. *C30B 29/06* (2013.01); *C30B 29/64* (2013.01); *C30B 30/00* (2013.01); *C30B 33/06* (2013.01)

(58) Field of Classification Search
CPC ......... C30B 29/06; C30B 29/64; C30B 30/00; C30B 33/06
See application file for complete search history.

(56) References Cited

U.S. PATENT DOCUMENTS

| | | | |
|---|---|---|---|
| 2016/0247713 A1* | 8/2016 | Drescher | B23K 26/53 |
| 2016/0288251 A1* | 10/2016 | Hirata | B23K 26/0853 |
| 2016/0354863 A1 | 12/2016 | Hirata | |
| 2019/0160708 A1* | 5/2019 | Hinohara | B23K 26/0853 |

FOREIGN PATENT DOCUMENTS

| | | |
|---|---|---|
| JP | 09262826 A | 10/1997 |
| JP | 2004216408 A * | 8/2004 |

OTHER PUBLICATIONS

Office Action issued in counterpart Singapore patent application No. 10202250734G, dated Aug. 22, 2024.

* cited by examiner

*Primary Examiner* — Robert M Kunemund
(74) *Attorney, Agent, or Firm* — Greer Burns & Crain Ltd.

(57) ABSTRACT

After separation layers are formed inside a single-crystal silicon ingot, a single-crystal silicon substrate is split off from the single-crystal silicon ingot with use of these separation layers as the point of origin. This can improve the productivity of the single-crystal silicon substrate compared with the case of manufacturing the single-crystal silicon substrate from the single-crystal silicon ingot by a wire saw.

8 Claims, 10 Drawing Sheets

MANUFACTURING METHOD OF SINGLE-CRYSTAL SILICON SUBSTRATE

BACKGROUND OF THE INVENTION

Field of the Invention

The present invention relates to a manufacturing method of a single-crystal silicon substrate by which the single-crystal silicon substrate is manufactured from a single-crystal silicon ingot manufactured in such a manner that the crystal plane {100} is exposed in each of a front surface and a back surface.

Description of the Related Art

Chips of a semiconductor device are typically manufactured by use of a single-crystal silicon substrate (hereinafter, also simply referred to as a "substrate") with a disc shape. This substrate is cut out from a single-crystal silicon ingot (hereinafter, also simply referred to as an "ingot") with a circular column shape by a wire saw, for example (for example, refer to Japanese Patent Laid-open No. H09-262826).

SUMMARY OF THE INVENTION

The cutting allowance when a substrate is cut out from an ingot by a wire saw is approximately 300 μm, which is relatively large. Moreover, minute irregularities are formed in a surface of the substrate thus cut out, and this substrate bends in whole (warpage occurs in the substrate). Thus, in this substrate, the surface thereof needs to be planarized through execution of lapping, etching, and/or polishing for the surface.

In this case, the amount of material of the single-crystal silicon that is ultimately used as the substrates is approximately ⅔ of the amount of material of the whole ingot. That is, approximately ⅓ of the amount of material of the whole ingot is discarded in the cutting-out of the substrates from the ingot and the planarization of the substrates. Thus, the productivity becomes low in the case of manufacturing the substrates by use of the wire saw as described above.

In view of this point, an object of the present invention is to provide a manufacturing method of a single-crystal silicon substrate with high productivity.

In accordance with an aspect of the present invention, there is provided a manufacturing method of a single-crystal silicon substrate by which the single-crystal silicon substrate is manufactured from a single-crystal silicon ingot manufactured in such a manner that a crystal plane {100} is exposed in each of a front surface and a back surface. The manufacturing method includes a holding step of holding the single-crystal silicon ingot whose side of the back surface is placed on a holding surface of a holding table by the holding table and a separation layer forming step of irradiating the single-crystal silicon ingot with a laser beam with such a wavelength as to be transmitted through single-crystal silicon from the side of the front surface while moving a focal point of the laser beam and the single-crystal silicon ingot relative to each other along a first direction that is parallel to the holding surface and that forms an acute angle of equal to or smaller than 5° with a crystal orientation <100> of the single-crystal silicon ingot, in a state in which the focal point is positioned inside the single-crystal silicon ingot, to form a separation layer in a linear region along the first direction inside the single-crystal silicon ingot. The manufacturing method also includes an indexing feed step of moving a position inside the single-crystal silicon ingot at which the focal point is formed by irradiation with the laser beam when the separation layer forming step is executed again, along a second direction that is parallel to the holding surface and is orthogonal to the first direction, and a splitting-off step of splitting off the single-crystal silicon substrate from the single-crystal silicon ingot with use of the separation layers as a point of origin after repeatedly executing the separation layer forming step and the indexing feed step to form the separation layers from a region on one end side in the second direction inside the single-crystal silicon ingot to a region on the other end side.

Moreover, it is preferable that the laser beam be split to generate a plurality of focal points that line up along the second direction in the separation layer forming step.

Further, it is preferable that, in the separation layer forming step, cracks extend along crystal planes that are crystal planes included in crystal planes {N10} (N is a natural number equal to or smaller than 10) and that are parallel to a crystal orientation that forms an acute angle of equal to or smaller than 5° with the first direction in crystal orientations <100> of the single-crystal silicon ingot.

Further, in the present invention, it is preferable that the separation layer forming step and the indexing feed step be repeatedly executed again after the separation layer forming step and the indexing feed step are repeatedly executed to form the separation layers from the region on the one end side to the region on the other end side.

Further, in the present invention, it is preferable that the separation layer forming step be executed again after the separation layer forming step but before the indexing feed step.

Further, it is preferable that the separation layer be formed in such a manner that the width of the separation layer along the second direction becomes a predetermined length in the separation layer forming step and the position inside the single-crystal silicon ingot at which the focal point is formed by irradiation with the laser beam be moved in such a manner that movement distance along the second direction is equal to or longer than the predetermined length in the indexing feed step.

Further, in the present invention, it is preferable that the manufacturing method further include a planarization step of grinding or polishing the front surface of the single-crystal silicon ingot to planarize the front surface before the holding step.

In the present invention, after the separation layers are formed inside the single-crystal silicon ingot, the single-crystal silicon substrate is split off from the single-crystal silicon ingot with use of these separation layers as the point of origin. This can improve the productivity of the single-crystal silicon substrate compared with the case of manufacturing the single-crystal silicon substrate from the single-crystal silicon ingot by a wire saw.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
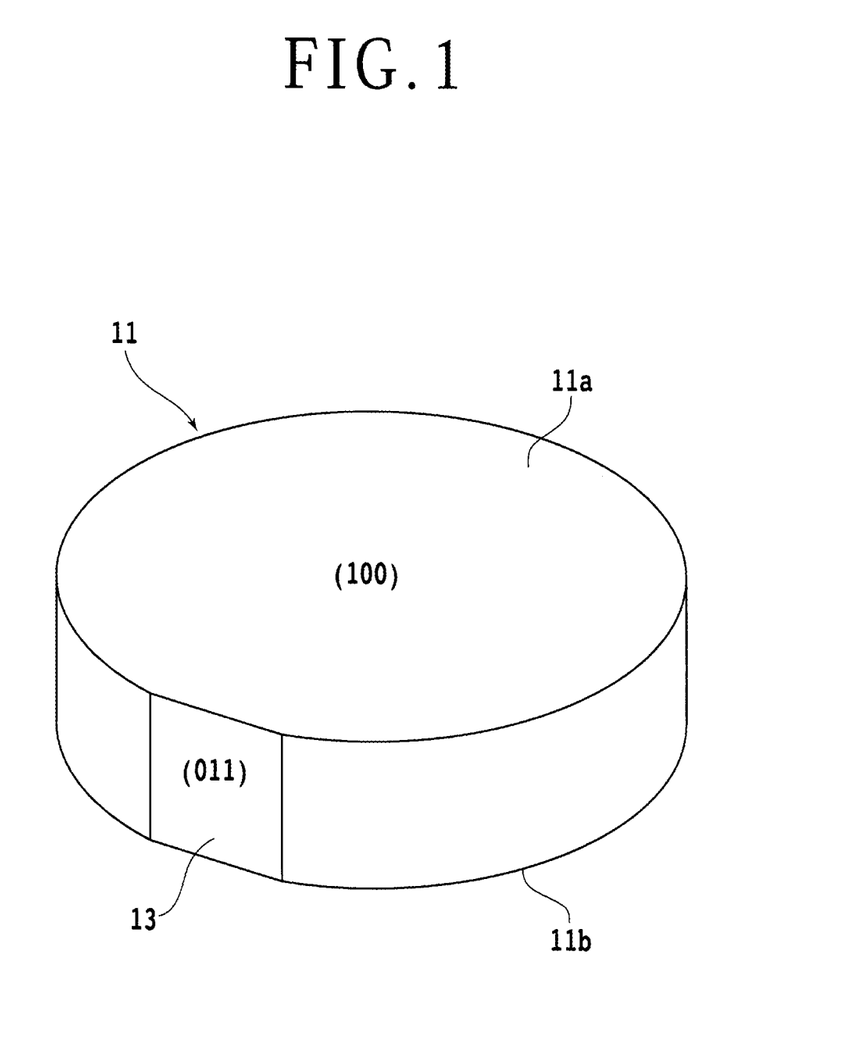
FIG. 1 is a perspective view schematically illustrating one example of a single-crystal silicon ingot.
Figure 2:
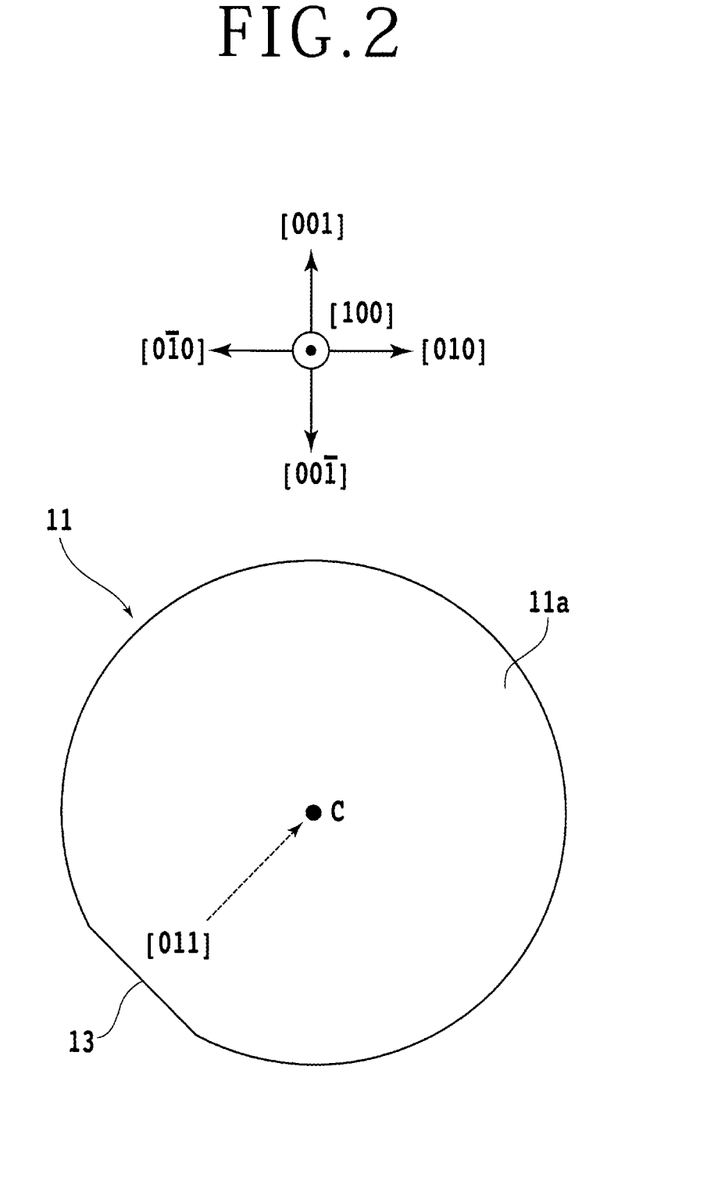
FIG. 2 is a plan view schematically illustrating the one example of the single-crystal silicon ingot.

An embodiment of the present invention will be described with reference to the accompanying drawings. FIG. 1 is a perspective view schematically illustrating one example of a single-crystal silicon ingot. FIG. 2 is a plan view schematically illustrating the one example of the single-crystal silicon ingot. In FIG. 1, crystal planes of single-crystal silicon exposed in planes included in this ingot are also illustrated. Moreover, in FIG. 2, crystal orientations of the single-crystal silicon that configures this ingot are also illustrated.

An ingot 11 illustrated in FIG. 1 and FIG. 2 is composed of circular columnar single-crystal silicon in which the crystal plane {100} (here, defined as a crystal plane (100) for convenience) is exposed in each of a front surface 11a and a back surface 11b. That is, the ingot 11 is composed of circular columnar single-crystal silicon in which the perpendicular line (crystal axis) of each of the front surface 11a and the back surface 11b is along the crystal orientation [100].

The ingot 11 is manufactured in such a manner that the crystal plane (100) is exposed in each of the front surface 11a and the back surface 11b. However, each of the front surface 11a and the back surface 11b may be a surface slightly inclined from the crystal plane (100) due to a processing error in the manufacturing, for example. Specifically, each of the front surface 11a and the back surface 11b of the ingot 11 may be a surface that forms the acute angle of equal to or smaller than 1° with the crystal plane (100). That is, the crystal axis of the ingot 11 may be along a direction that forms the acute angle of equal to or smaller than 1° with the crystal orientation [100].

Furthermore, an orientation flat 13 is formed in the side surface of the ingot 11, and a center C of the ingot 11 is located in the crystal orientation <110> (here, defined as a crystal orientation [011] for convenience) as viewed from the orientation flat 13. That is, the crystal plane (011) of the single-crystal silicon is exposed in the orientation flat 13.

Figure 3:
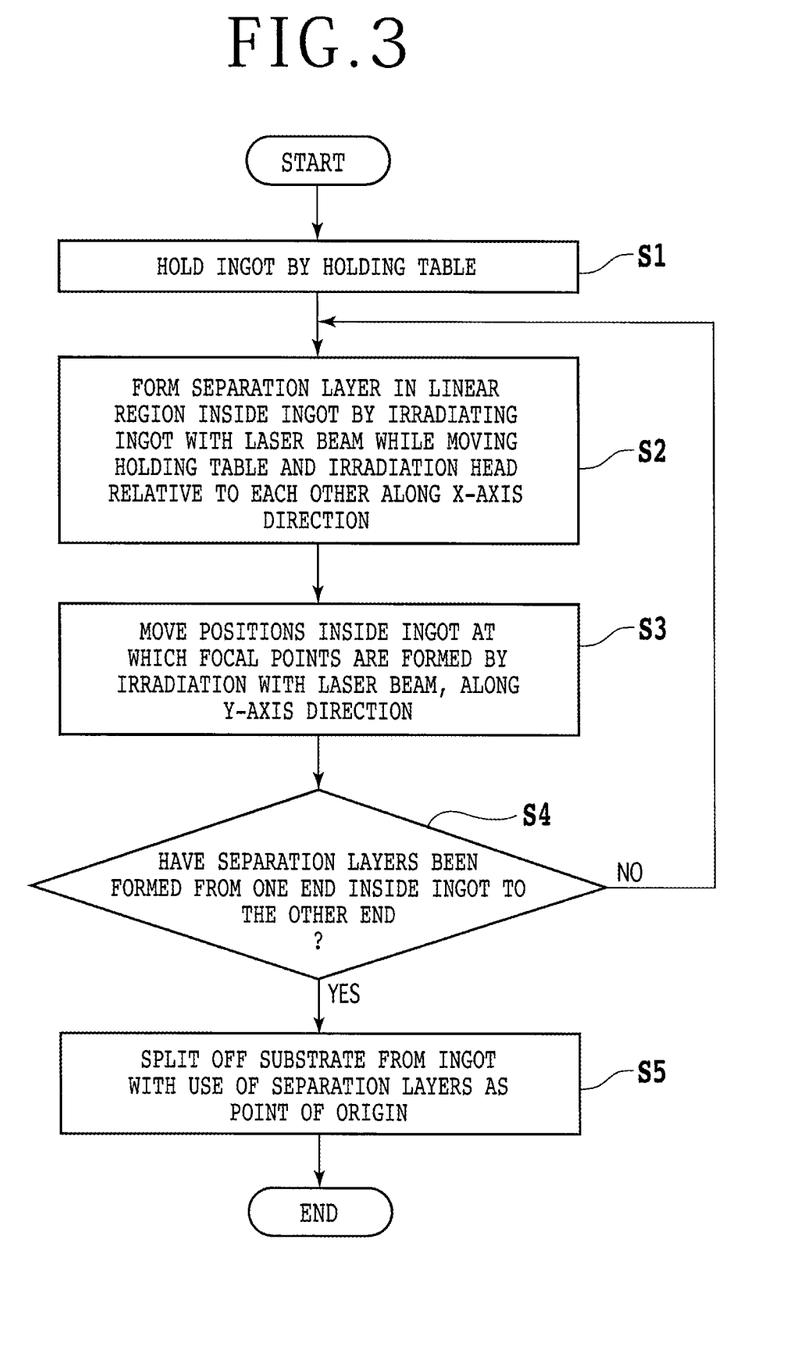
FIG. 3 is a flowchart schematically illustrating one example of a manufacturing method of a single-crystal silicon substrate.

FIG. 3 is a flowchart schematically illustrating one example of a manufacturing method of a single-crystal silicon substrate by which a substrate is manufactured from the ingot 11. Simply described, in this method, separation layers are formed inside the ingot 11 by use of a laser processing apparatus, and thereafter, the substrate is separated from the ingot 11 with use of these separation layers as the point of origin.

Figure 4:
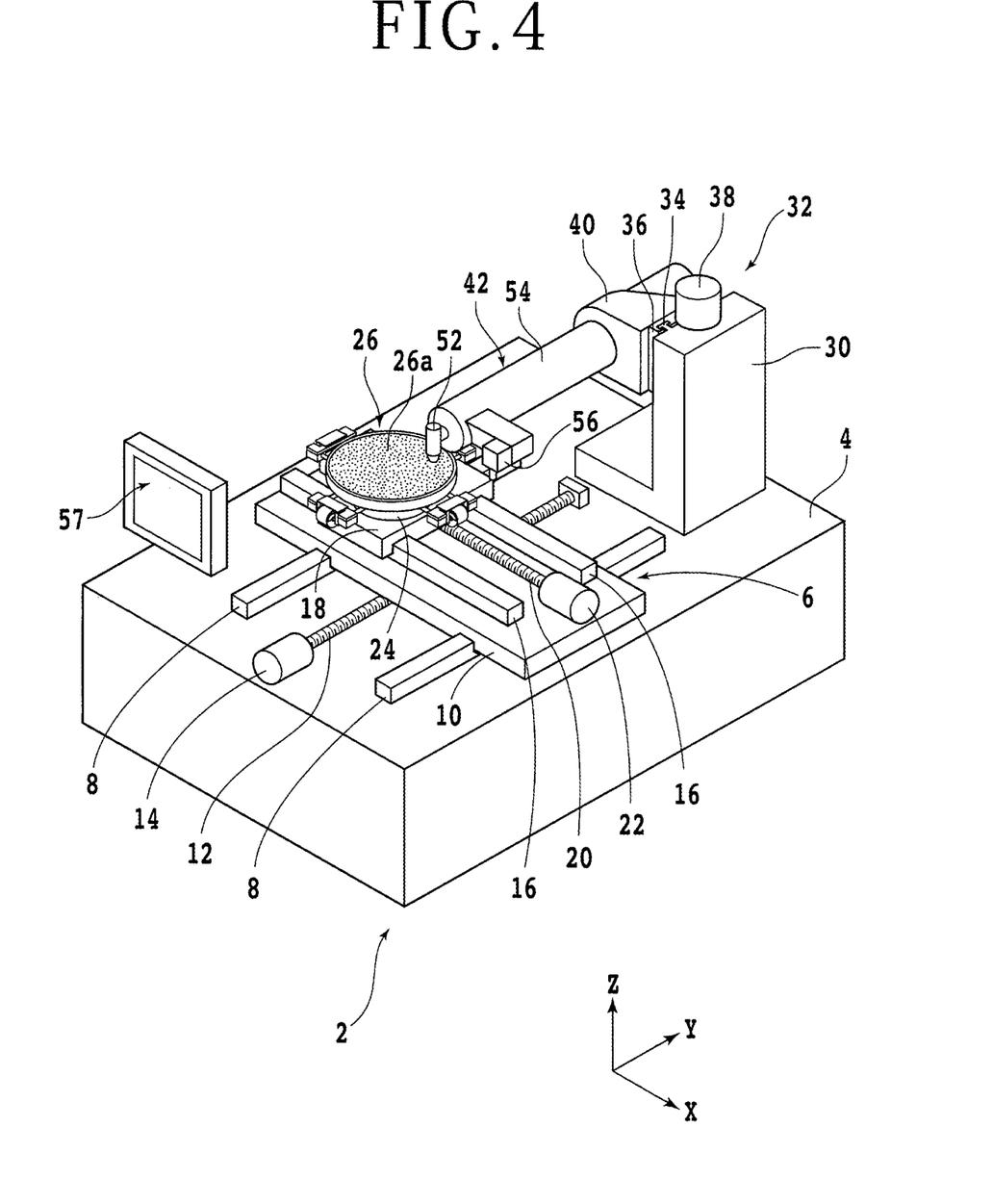
FIG. 4 is a perspective view schematically illustrating one example of a laser processing apparatus.

FIG. 4 is a perspective view schematically illustrating one example of the laser processing apparatus used in this method. An X-axis direction (left-right direction) and a Y-axis direction (front-rear direction) illustrated in FIG. 4 are directions orthogonal to each other on the horizontal plane. Furthermore, a Z-axis direction (upward-downward direction) is the direction (vertical direction) orthogonal to each of the X-axis direction and the Y-axis direction.

A laser processing apparatus 2 illustrated in FIG. 4 has a base 4 that supports the respective constituent elements. A horizontal movement mechanism 6 is disposed on the upper surface of the base 4. Moreover, the horizontal movement mechanism 6 has a pair of Y-axis guide rails 8 that are fixed to the upper surface of the base 4 and extend along the Y-axis direction.

A Y-axis moving plate 10 is coupled to the upper surface side of the pair of Y-axis guide rails 8 slidably along the pair of Y-axis guide rails 8. Moreover, a screw shaft 12 that extends along the Y-axis direction is disposed between the pair of Y-axis guide rails 8. A motor 14 for rotating the screw shaft 12 is coupled to the front end part (one end part) of the screw shaft 12.

Further, a nut part (not illustrated) that houses a large number of balls that roll on the surface of the screw shaft 12 that rotates is disposed on the surface of the screw shaft 12 in which a spiral groove is formed, so that a ball screw is configured. That is, when the screw shaft 12 rotates, the large number of balls circulate in the nut part, and the nut part moves along the Y-axis direction.

Moreover, the nut part is fixed to the lower surface side of the Y-axis moving plate 10. Thus, the Y-axis moving plate 10 moves along the Y-axis direction together with the nut part when the screw shaft 12 is rotated by the motor 14. Further, a pair of X-axis guide rails 16 that extend along the X-axis direction are fixed to the upper surface of the Y-axis moving plate 10.

An X-axis moving plate 18 is coupled to the upper surface side of the pair of X-axis guide rails 16 slidably along the pair of X-axis guide rails 16. Moreover, a screw shaft 20 that extends along the X-axis direction is disposed between the pair of X-axis guide rails 16. A motor 22 for rotating the screw shaft 20 is coupled to one end part of the screw shaft 20.

Further, a nut part (not illustrated) that houses a large number of balls that roll on the surface of the screw shaft 20 that rotates is disposed on the surface of the screw shaft 20 in which a spiral groove is formed, so that a ball screw is configured. That is, when the screw shaft 20 rotates, the large number of balls circulate in the nut part, and the nut part moves along the X-axis direction.

Further, this nut part is fixed to the lower surface side of the X-axis moving plate 18. Thus, the X-axis moving plate 18 moves along the X-axis direction together with the nut part when the screw shaft 20 is rotated by the motor 22.

A table base 24 with a circular column shape is disposed on the upper surface side of the X-axis moving plate 18. A holding table 26 that holds the ingot 11 is disposed at the upper part of the table base 24. The holding table 26 has a circular upper surface (holding surface) parallel to the X-axis direction and the Y-axis direction, for example, and a porous plate 26a is exposed in this holding surface.

Further, a rotational drive source (not illustrated) such as a motor is coupled to the lower part of the table base 24. Moreover, when this rotational drive source operates, the holding table 26 rotates with a straight line that passes through the center of the holding surface and is parallel to the Z-axis direction being the rotation axis. Further, the holding table 26 moves along the X-axis direction and/or the Y-axis direction when the above-described horizontal movement mechanism 6 operates.

Moreover, the porous plate 26a communicates with a suction source (not illustrated) such as a vacuum pump through a flow path made inside the holding table 26, for example. Further, a negative pressure is generated in a space in the vicinity of the holding surface of the holding table 26 when this suction source operates. As a result, for example, the ingot 11 whose side of the back surface 11b is placed on the holding surface can be held by the holding table 26.

Further, a support structure 30 having side surfaces substantially parallel to the Y-axis direction and the Z-axis direction is disposed on a region on the rear side of the base 4. A vertical movement mechanism 32 is disposed on the side surface of the support structure 30. Moreover, the vertical movement mechanism 32 has a pair of Z-axis guide rails 34 that are fixed to the side surface of the support structure 30 and extend along the Z-axis direction.

A Z-axis moving plate 36 is coupled to the surface side of the pair of Z-axis guide rails 34 slidably along the pair of Z-axis guide rails 34. Moreover, a screw shaft (not illustrated) that extends along the Z-axis direction is disposed between the pair of Z-axis guide rails 34. A motor 38 for rotating the screw shaft is coupled to the upper end part (one end part) of the screw shaft.

Further, a nut part (not illustrated) that houses a large number of balls that roll on the surface of the screw shaft that rotates is disposed on the surface of the screw shaft in which a spiral groove is formed, so that a ball screw is configured. That is, when this screw shaft rotates, the large number of balls circulate in the nut part, and the nut part moves along the Z-axis direction.

Moreover, this nut part is fixed to the back surface side of the Z-axis moving plate 36. Thus, the Z-axis moving plate 36 moves along the Z-axis direction together with the nut part when the screw shaft disposed between the pair of Z-axis guide rails 34 is rotated by the motor 38.

Figure 5:
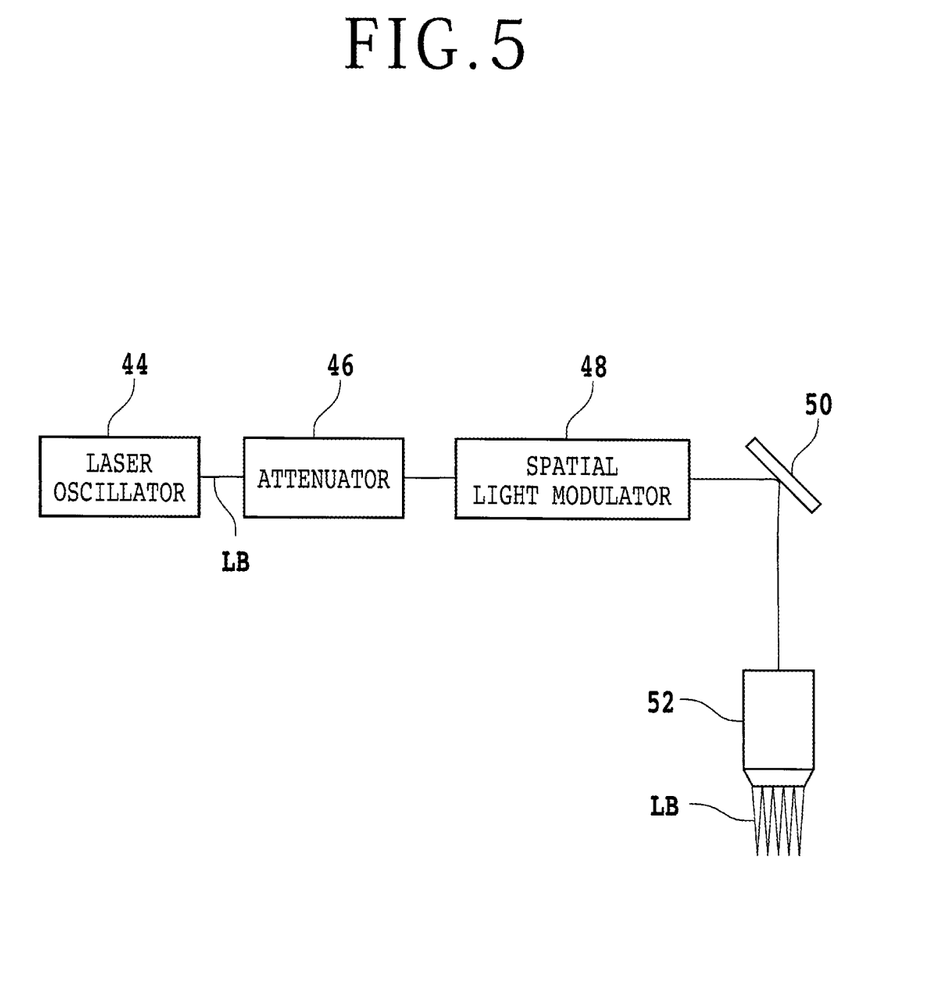
FIG. 5 is a diagram schematically illustrating the state in which a laser beam travels in a laser beam irradiation unit.

A support implement 40 is fixed to the surface side of the Z-axis moving plate 36. The support implement 40 supports part of a laser beam irradiation unit 42. FIG. 5 is a diagram schematically illustrating the state in which a laser beam LB travels in the laser beam irradiation unit 42. In FIG. 5, some of the constituent elements of the laser beam irradiation unit 42 are illustrated by functional blocks.

The laser beam irradiation unit 42 has a laser oscillator 44 fixed to the base 4. For example, the laser oscillator 44 has neodymium doped yttrium aluminum garnet (Nd:YAG) or the like as a laser medium and emits the pulsed laser beam LB with such a wavelength (for example, 1064 nm) as to be transmitted through single-crystal silicon.

This laser beam LB is supplied to a spatial light modulator 48 after its output power is adjusted in an attenuator 46. Further, the laser beam LB is split in the spatial light modulator 48. For example, the spatial light modulator 48 splits the laser beam LB in such a manner that the laser beam LB emitted from an irradiation head 52 to be described later forms multiple (for example, five) focal points that line up at equal intervals along the Y-axis direction.

Further, the laser beam LB split in the spatial light modulator 48 is reflected by a mirror 50 and is guided to the irradiation head 52. A collecting lens (not illustrated) that focuses the laser beam LB and so forth are housed in the irradiation head 52. Further, the laser beam LB focused by this collecting lens is emitted to the holding surface side of the holding table 26.

As illustrated in FIG. 4, the irradiation head 52 is disposed at the front end part of a housing 54 with a circular column shape. Further, the support implement 40 is fixed to the side surface of the housing 54 on the rear side. Further, an imaging unit 56 is fixed to the side surface of the housing 54 on the front side.

For example, the imaging unit 56 has such a light source as a light emitting diode (LED), an objective lens, and such an imaging element as a charge coupled device (CCD) image sensor or a complementary metal oxide semiconductor (CMOS) image sensor.

Moreover, the irradiation head 52, the housing 54, and the imaging unit 56 move along the Z-axis direction when the above-described vertical movement mechanism 32 operates. In addition, a cover (not illustrated) that covers the above-described constituent elements is disposed over the base 4. A touch panel 57 is disposed on the front surface of this cover.

The touch panel 57 is configured by an input device such as a touch sensor of the capacitive system or the resistive film system and a display device such as a liquid crystal display or an organic electroluminescence (EL) display, for example, and functions as a user interface.

Figure 6:
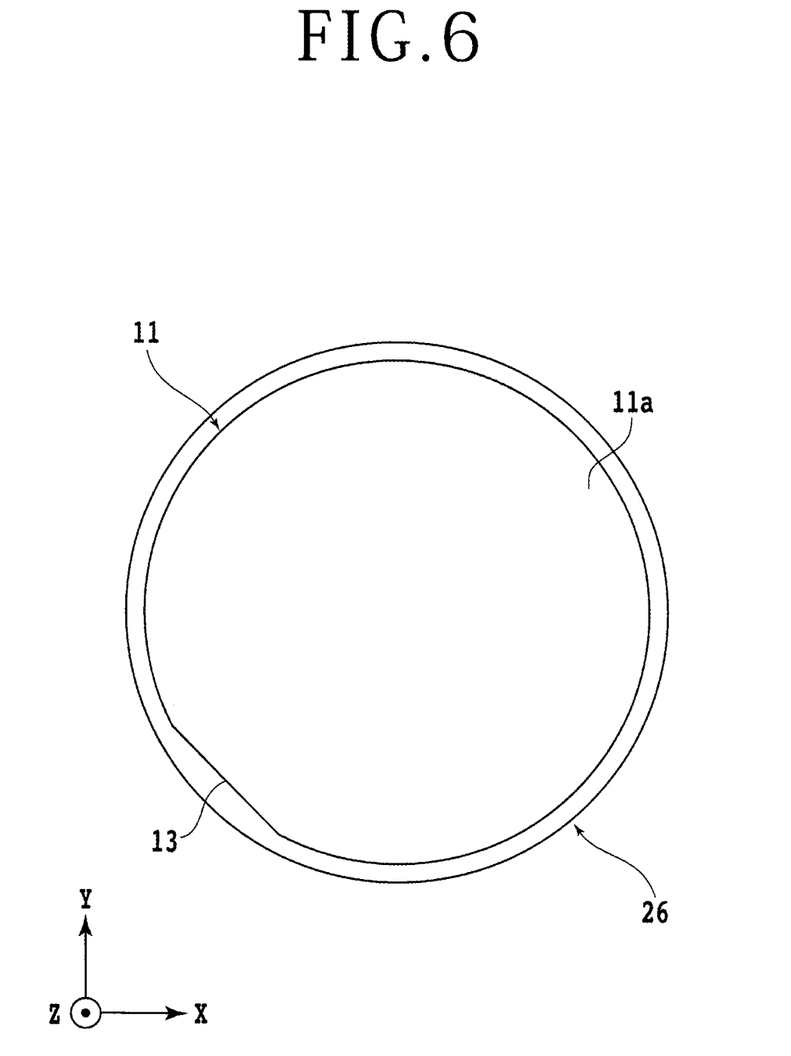
FIG. 6 is a plan view schematically illustrating the ingot and a holding table that have undergone a holding step.

In the manufacturing method of a single-crystal silicon substrate illustrated in FIG. 3, first, the ingot 11 is held by the holding table 26 (holding step: S1). FIG. 6 is a plan view schematically illustrating the ingot 11 and the holding table 26 that have undergone the holding step (S1).

For the ingot 11, the side of the back surface 11b is placed on the holding surface of the holding table 26 to expose the front surface 11a. Further, a negative pressure generated by operation of the suction source that communicates with the porous plate 26a acts on the side of the back surface 11b of the ingot 11. As a result, the ingot 11 is held by the holding table 26.

Moreover, the holding table 26 holds the ingot 11 in such a manner that the acute angle formed by the direction from the orientation flat 13 formed in the side surface of the ingot 11 toward the center C of the ingot 11 (crystal orientation [011] of single-crystal silicon) and the X-axis direction or the Y-axis direction is 45°. Adjustment of such a position of the ingot 11 is executed by rotation of the holding table 26 by the rotational drive source coupled to the lower part of the table base 24, in reference to an image formed through imaging by the imaging unit 56, for example.

Subsequently, a separation layer is formed in a linear region inside the ingot 11 by irradiation of the ingot 11 with the laser beam LB while the holding table 26 and the irradiation head 52 are moved relative to each other along the X-axis direction (separation layer forming step: S2). For example, in the separation layer forming step (S2), the ingot 11 is irradiated with the laser beam LB while the holding table 26 is moved along the X-axis direction.

Figure 7:
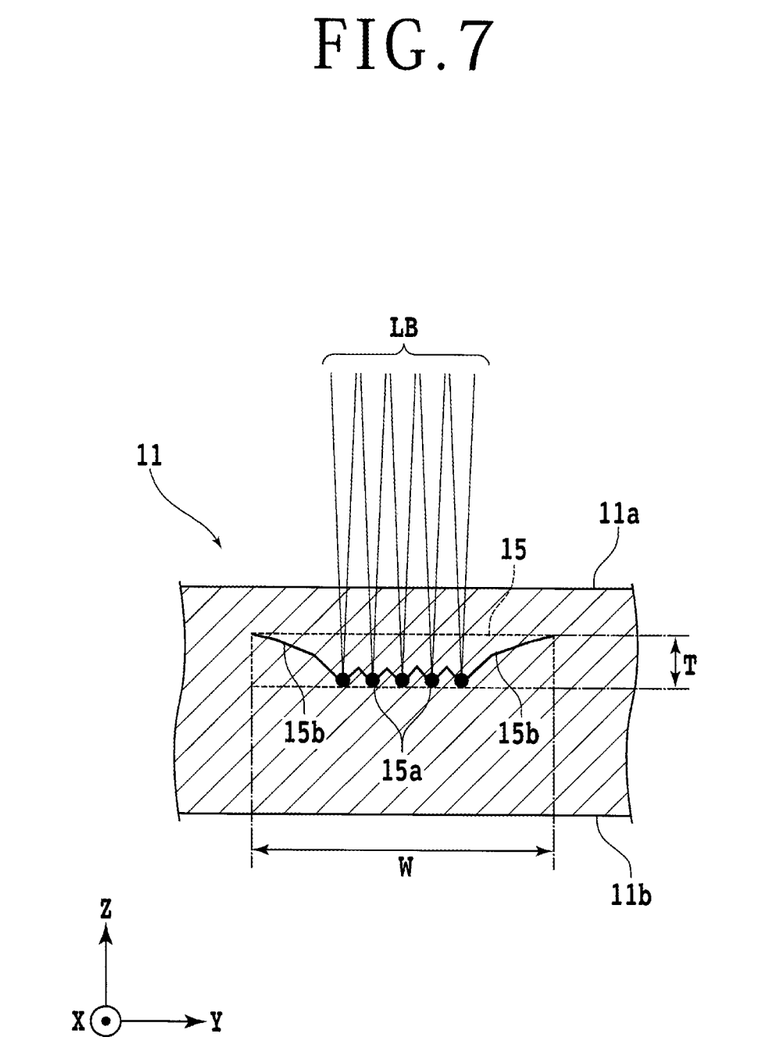
FIG. 7 is a sectional view schematically illustrating the state in which the ingot is irradiated with the laser beam.

FIG. 7 is a sectional view schematically illustrating the state in which the ingot 11 is irradiated with the laser beam LB from the side of the front surface 11a of the ingot 11. The ingot 11 is held by the holding table 26 in such a manner that the crystal orientation [010] of the single-crystal silicon is parallel to the X-axis direction, for example (see FIG. 2 and FIG. 6). Hence, the irradiation with the laser beam LB is executed along the crystal orientation [010] of the single-crystal silicon.

Further, the laser beam LB is split, and the irradiation is executed in the state in which each of multiple focal points thereof is positioned inside the ingot 11. Then, a modified region 15a arising from disordering of the crystal structure of the single-crystal silicon is formed inside the ingot 11 around each of the multiple focal points. That is, multiple modified regions 15a that line up along the Y-axis direction are formed.

At this time, cracks 15b extend along a predetermined crystal plane from each of the multiple modified regions 15a. As a result, a separation layer 15 including the multiple modified regions 15a and the cracks 15b that extend from each of the multiple modified regions 15a is formed inside the ingot 11.

Here, in general, the single-crystal silicon is cleaved along the crystal plane {111} most easily and is cleaved along the crystal plane {110} second most easily. Hence, for example, when the modified region is formed along the crystal orientation <110> of the single-crystal silicon that configures the ingot (for example, direction from the orientation flat 13 formed in the side surface of the ingot 11 toward the center C of the ingot 11 (crystal orientation [011])), there occur many cracks that extend along the crystal plane {111} from this modified region.

On the other hand, when multiple modified regions are formed in a linear region along the crystal orientation <100> of the single-crystal silicon in such a manner as to line up along the direction orthogonal to the direction in which this linear region extends in plan view, there occur many cracks that extend along crystal planes parallel to the direction in which the linear region extends in crystal planes {N10} (N is a natural number equal to or smaller than 10) from each of these multiple modified regions.

For example, when multiple modified regions 15a are formed in a linear region along the crystal orientation [010] (X-axis direction) in such a manner as to line up along the direction (Y-axis direction) orthogonal to the direction in which this linear region extends in plan view as described above, there occur many cracks that extend along crystal planes parallel to the crystal orientation [010] of the single-crystal silicon in crystal planes {N10} (N is a natural number equal to or smaller than 10) from each of these multiple modified regions 15a.

Specifically, when the multiple modified regions 15a are formed as described above, cracks easily extend in the following crystal planes.

(101),(201),(301),(401),(501),(601),(701),(801),(901),($\overline{1}$001)  [Expression 1]

($\overline{1}$01),($\overline{2}$01),($\overline{3}$01),($\overline{4}$01),($\overline{5}$01),($\overline{6}$01),($\overline{7}$01),($\overline{8}$01),($\overline{9}$01),($\overline{10}$01)  [Expression 2]

Further, the acute angles formed by the crystal plane (100) exposed in the front surface 11a and the back surface 11b of the ingot 11 and crystal planes parallel to the crystal orientation [010] of the single-crystal silicon in crystal planes {N10} of the single-crystal silicon are equal to or smaller than 45°. On the other hand, the acute angle formed by the crystal plane (100) and the crystal plane {111} of the single-crystal silicon is approximately 54.7°.

Thus, in the case in which the ingot 11 is irradiated with the laser beam LB along the crystal orientation [010] of the single-crystal silicon (former case), the separation layer 15 tends to have a wider width and be thinner compared with the case in which irradiation with the laser beam LB is executed along the crystal orientation [011] (latter case). That is, the value of the ratio between the width (W) and the thickness (T) (W/T) of the separation layer 15 illustrated in FIG. 7 becomes larger in the former case than in the latter case.

Subsequently, the positions inside the ingot 11 at which focal points are formed by irradiation with the laser beam LB are moved along the Y-axis direction (indexing feed step: S3). For example, in the indexing feed step (S3), the holding table 26 is moved along the Y-axis direction. The movement distance (index) of the holding table 26 along the Y-axis direction is set to be equal to or longer than the width (W) of the above-described separation layer 15, for example.

Figure 8:
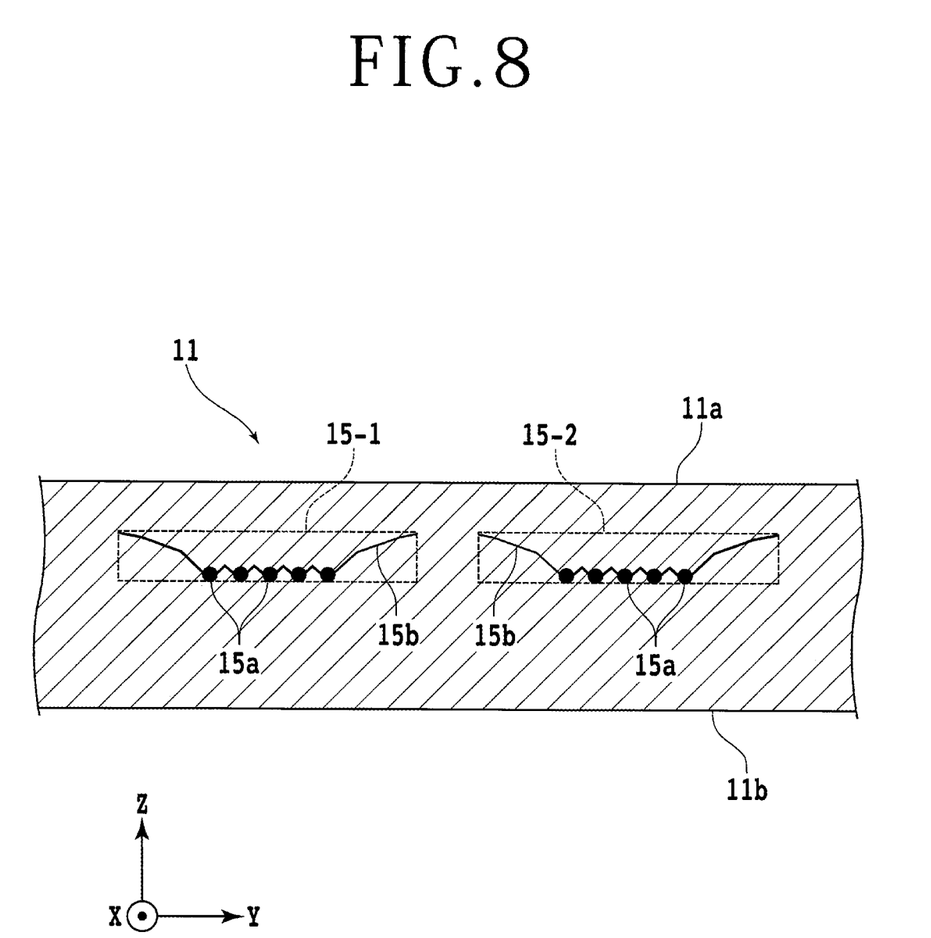
FIG. 8 is a sectional view schematically illustrating an adjacent separation layer formed inside the ingot.

Specifically, the index is set to approximately 530 μm when the width (W) of the separation layer 15 is a predetermined length included in a range of 250 to 280 μm. Next, the above-described separation layer forming step (S2) is executed again. FIG. 8 is a sectional view schematically illustrating an adjacent separation layer formed inside the ingot 11 by execution of a second round of the separation layer forming step (S2).

In this case, the separation layer 15 (separation layer 15-2) that is parallel to the separation layer 15 (separation layer 15-1) formed in the first round of the separation layer forming step (S2) and is separate from the separation layer 15-1 in the Y-axis direction is formed inside the ingot 11. Moreover, the indexing feed step (S3) and the separation layer forming step (S2) are repeatedly executed to cause the separation layers 15 to be formed from a region on one end side in the Y-axis direction inside the ingot 11 to a region on the other end side.

Figure 9:
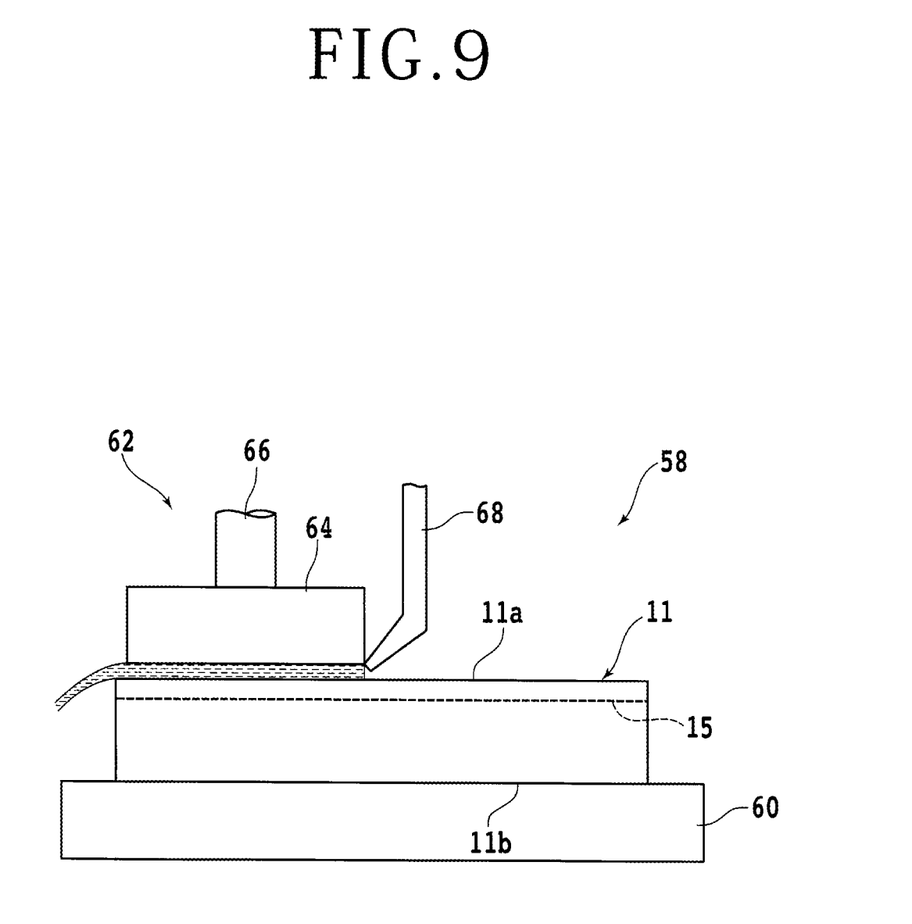
FIG. 9 is a side view schematically illustrating the state in which a splitting-off step is executed in an ultrasonic application apparatus.

Then, when the separation layers 15 have been formed from the region on the one end side in the Y-axis direction inside the ingot 11 to the region on the other end side (step (S4): YES), the substrate is split off from the ingot 11 with use of the separation layers 15 as the point of origin (splitting-off step: S5). FIG. 9 is a side view schematically illustrating the state in which the splitting-off step (S5) is executed in an ultrasonic application apparatus.

An ultrasonic application apparatus 58 illustrated in FIG. 9 has a chuck table 60 with a circular column shape. The upper surface of the chuck table 60 becomes a holding surface that holds the side of the back surface 11b of the ingot 11. An annular groove is formed in this holding surface, and an opening is formed in the bottom surface of this groove. This opening communicates with a suction source such as a vacuum pump through a flow path made inside the chuck table 60.

Hence, the chuck table 60 holds the ingot 11 when the suction source operates in a state in which the side of the back surface 11b of the ingot 11 is placed on the holding surface of the chuck table 60. Further, an ultrasonic application unit 62 is disposed over the chuck table 60. The ultrasonic application unit 62 has a vibrating member 64 with a circular column shape.

The vibrating member 64 is disposed to allow the lower end surface of the vibrating member 64 to face the front surface 11a of the ingot 11 held by the chuck table 60. Further, the vibrating member 64 incorporates an ultrasonic oscillator, and the whole of the vibrating member 64 vibrates due to vibration by this ultrasonic oscillator.

Moreover, the tip (lower end) part of a drive shaft 66 is fixed to a central region of the upper surface of the vibrating member 64. The drive shaft 66 is coupled to a vertical movement mechanism (not illustrated) and a horizontal movement mechanism (not illustrated) that can operate independently of each other. Each of the vertical movement mechanism and the horizontal movement mechanism includes a ball screw, for example.

Further, the drive shaft 66 moves along the vertical direction when this vertical movement mechanism operates, and the drive shaft 66 moves along the horizontal direction when this horizontal movement mechanism operates. Moreover, a liquid nozzle 68 is disposed on a lateral side of the ultrasonic application unit 62. The liquid nozzle 68 supplies liquid from an opening made in the lower end surface thereof to a space between the lower end surface of the vibrating member 64 and the front surface 11a of the ingot 11.

In execution of the splitting-off step (S5) in the ultrasonic application apparatus 58, first, the side of the back surface 11b of the ingot 11 is placed on the holding surface of the chuck table 60. Subsequently, the suction source that communicates with the opening formed in the bottom surface of the groove of the holding surface of the chuck table 60 is operated. As a result, the ingot 11 is held by the chuck table 60.

Next, the vertical movement mechanism lowers the drive shaft 66 to bring the lower end surface of the vibrating member 64 close to the front surface 11a of the ingot 11. Subsequently, the ultrasonic oscillator incorporated in the vibrating member 64 is vibrated while the liquid is supplied from the liquid nozzle 68 to the space between the lower end surface of the vibrating member 64 and the front surface 11a of the ingot 11 and the horizontal movement mechanism moves the drive shaft 66.

This leads to ultrasonic being applied to the separation layers 15 formed inside the ingot 11. As a result, the cracks 15b included in the separation layers 15 further extend. For example, the crack 15b included in the separation layer 15-1 illustrated in FIG. 8 and the crack 15b included in the separation layer 15-2 each extend, and the cracks 15b of the two layers connect with each other. As a result, the ingot 11 is split at the separation layers 15, and a substrate is manufactured.

In the manufacturing method of a single-crystal silicon substrate illustrated in FIG. 3, after the separation layers 15 are formed inside the ingot 11, the substrate is split off from the ingot 11 with use of the separation layers 15 as the point of origin. Owing to this, the productivity of the substrate can be improved compared with the case of manufacturing the substrate from the ingot 11 by a wire saw.

Moreover, in the above-described method, by irradiating a linear region along the crystal orientation [010] with the split laser beam LB, the multiple modified regions 15a are formed to line up along the direction orthogonal to the direction in which this linear region extends in plan view. In this case, there occur many cracks 15b that extend along crystal planes parallel to the crystal orientation [010] of the single-crystal silicon in crystal planes {N10} (N is a natural number equal to or smaller than 10) from each of the multiple modified regions 15a.

Owing to this, in the above-described method, the separation layer 15 can be allowed to have a wider width and be thinner compared with the case in which the ingot 11 is irradiated with the laser beam LB along the crystal orientation [011] of the single-crystal silicon. As a result, the amount of material discarded when substrates are manufactured from the ingot 11 can be reduced, and the productivity of the substrate can be further improved.

The above-described manufacturing method of a single-crystal silicon substrate is one aspect of the present invention, and the present invention is not limited to the above-described method. For example, the ingot used for manufacturing a substrate in the present invention is not limited to the ingot 11 illustrated in FIG. 1, FIG. 2, and so forth.

Specifically, in the present invention, a substrate may be manufactured from an ingot in which a notch is formed in the side surface. Alternatively, in the present invention, a substrate may be manufactured from an ingot in which neither an orientation flat nor a notch is formed in the side surface.

Further, the structure of the laser processing apparatus used in the present invention is not limited to the structure of the above-described laser processing apparatus 2. For example, the present invention may be carried out by using a laser processing apparatus equipped with a horizontal movement mechanism that moves the irradiation head 52 and so forth of the laser beam irradiation unit 42 along each of the X-axis direction and/or the Y-axis direction.

That is, in the present invention, it suffices that the holding table 26 that holds the ingot 11 and the irradiation head 52 of the laser beam irradiation unit 42 that emits the laser beam LB can move relative to each other along each of the X-axis direction and the Y-axis direction, and there is no limitation on the structure for this purpose.

Moreover, in the present invention, the linear region inside the ingot 11 irradiated with the laser beam LB in the separation layer forming step (S2) is not limited to the linear region along the crystal orientation [010]. For example, in the present invention, a linear region along the crystal orientation [001] may be irradiated with the laser beam LB.

When the ingot 11 is irradiated with the laser beam LB as described above, cracks easily extend in the following crystal planes.

$$(110),(210),(310),(410),(510),(610),(710),(810),(910),(\underline{10}10) \quad \text{[Expression 3]}$$

$$(\bar{1}10),(\bar{2}10),(\bar{3}10),(\bar{4}10),(\bar{5}10),(\bar{6}10),(\bar{7}10),(\bar{8}10),(\bar{9}10),(\overline{10}10) \quad \text{[Expression 4]}$$

Moreover, in the present invention, a linear region along a direction slightly inclined from the crystal orientation [010] or the crystal orientation [001] in plan view may be irradiated with the laser beam LB. Regarding this point, description will be made with reference to FIG. 10.

Figure 10:
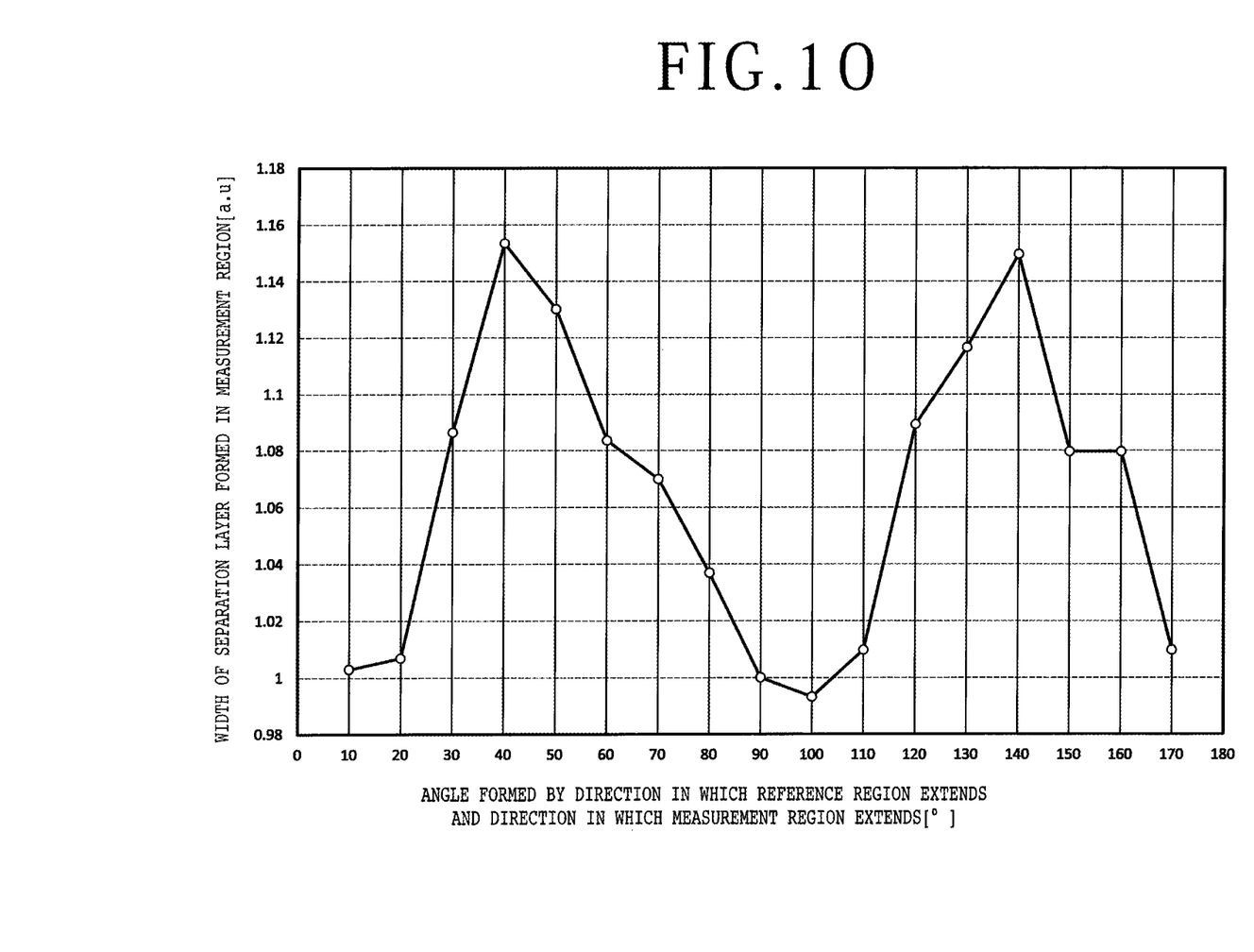
FIG. 10 is a graph illustrating the width of the separation layer formed inside the ingot when linear regions that are each along a different crystal orientation are irradiated with the laser beam.

FIG. 10 is a graph illustrating the width (width (W) illustrated in FIG. 7) of the separation layer formed inside the ingot 11 when linear regions that are each along a different crystal orientation are irradiated with the laser beam LB. The abscissa axis of this graph indicates the angle formed by the direction in which a linear region orthogonal to the crystal orientation [011] (reference region) extends and the direction in which a linear region that becomes a measurement subject (measurement region) extends.

That is, when the value of the abscissa axis of this graph is 45°, the linear region along the crystal orientation [001] is the measurement subject. Similarly, when the value of the abscissa axis of this graph is 135°, the linear region along the crystal orientation [010] is the measurement subject. Further, the ordinate axis of this graph indicates the value obtained when the width of the separation layer formed in the measurement region by irradiation of the measurement region with the laser beam LB is divided by the width of the separation layer formed in the reference region by irradiation of the reference region with the laser beam LB.

As illustrated in FIG. 10, the width of the separation layer becomes wide when the angle formed by the direction in which the reference region extends and the direction in which the measurement region extends falls within the range of 40° to 50° or 130° to 140°. That is, the width of the separation layer becomes wide not only when the linear region along the crystal orientation [001] or the crystal orientation [010] is irradiated with the laser beam LB but also when the linear region along a direction that forms the acute angle of equal to or smaller than 5° with either of these crystal orientations is irradiated with the laser beam LB.

Thus, in the present invention, the linear region along a direction inclined from the crystal orientation [001] or the crystal orientation [010] by at most 5° in plan view may be irradiated with the laser beam LB.

Further, in the present invention, after the separation layers 15 have been formed from the region on the one end side in the Y-axis direction inside the ingot 11 to the region on the other end side (step S4: YES), the separation layer forming step (S2) and the indexing feed step (S3) may be repeatedly executed again. That is, irradiation with the laser beam LB to form the separation layers 15 may be executed again for the range in which the separation layers 15 have already been formed from the region on the one end side in the Y-axis direction inside the ingot 11 to the region on the other end side.

In this case, the density of each of the modified regions 15a and the cracks 15b included in the separation layers 15 increases. As a result, the splitting-off of the substrate from the ingot 11 in the splitting-off step (S5) becomes easy.

Moreover, in the present invention, after the separation layer forming step (S2) but before the indexing feed step (S3), the separation layer forming step (S2) may be executed again. That is, irradiation with the laser beam LB to form the separation layer 15 may be executed again for the linear region inside the ingot 11 in which the separation layer 15 has already been formed.

In this case, as in the above description, the splitting-off of the substrate from the ingot 11 in the splitting-off step (S5) becomes easy. Moreover, in this case, the cracks 15b included in the separation layer 15 further extend. That is, the width (width (W) illustrated in FIG. 7) of the separation layer 15 becomes wider. Thus, in this case, the movement distance (index) of the holding table 26 along the Y-axis direction in the indexing feed step (S3) can be set longer.

Further, in the present invention, prior to the holding step (S1), the front surface 11a of the ingot 11 may be planarized by grinding or polishing (planarization step). For example, this planarization may be executed when multiple substrates are manufactured from the ingot 11. Specifically, when the ingot 11 is split at the separation layers 15 and a substrate is manufactured, irregularities that reflect the distribution of the modified regions 15a and the cracks 15b included in the separation layers 15 are formed in the front surface of the ingot 11 newly exposed.

As such, in the case of manufacturing a new substrate from the ingot 11, it is preferable to planarize the front surface of the ingot 11 prior to the holding step (S1). This can suppress diffuse reflection of the laser beam LB with which the ingot 11 is irradiated in the separation layer forming step (S2) at the front surface of the ingot 11.

Similarly, in the present invention, the surface on the side of the separation layer 15 in the substrate split off from the ingot 11 may be planarized by grinding or polishing. Besides, structures, methods, and so forth according to the above-described embodiment can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method of a single-crystal silicon substrate by which the single-crystal silicon substrate is manufactured from a single-crystal silicon ingot manufactured in such a manner that a crystal plane {100} is exposed in each of a front surface and a back surface, the manufacturing method comprising:
    a holding step of holding the single-crystal silicon ingot whose side of the back surface is placed on a holding surface of a holding table by the holding table;
    a separation layer forming step of irradiating the single-crystal silicon ingot with a laser beam with such a wavelength as to be transmitted through single-crystal silicon from a side of the front surface while moving a focal point of the laser beam and the single-crystal silicon ingot relative to each other along a first direction that is parallel to the holding surface and that is inclined at an acute angle of equal to or smaller than 5° with a crystal orientation <100> of the single-crystal silicon ingot, in a state in which the focal point is positioned inside the single-crystal silicon ingot, to form a separation layer in a linear region along the first direction inside the single-crystal silicon ingot;
    an indexing feed step of moving a position inside the single-crystal silicon ingot at which the focal point is formed by irradiation with the laser beam when the separation layer forming step is executed again along a second direction that is parallel to the holding surface and is orthogonal to the first direction; and
    a splitting-off step of splitting off the single-crystal silicon substrate from the single-crystal silicon ingot with use of the separation layers as a point of origin after repeatedly executing the separation layer forming step and the indexing feed step to form the separation layers from a region on one end side in the second direction inside the single-crystal silicon ingot to a region on the other end side.

2. The manufacturing method of a single-crystal silicon substrate according to claim 1, wherein;
    the laser beam is split to generate a plurality of focal points that line up along the second direction in the separation layer forming step.

3. The manufacturing method of a single-crystal silicon substrate according to claim 1, wherein,
    in the separation layer forming step, cracks extend along crystal planes that are crystal planes included in crystal planes {N10} (N is a natural number equal to or smaller than 10) and that are parallel to a crystal orientation that forms an acute angle of equal to or smaller than 5° with the first direction in crystal orientations <100> of the single-crystal silicon ingot.

4. The manufacturing method of a single-crystal silicon substrate according to claim 1, wherein;
    the separation layer forming step and the indexing feed step are repeatedly executed again after the separation layer forming step and the indexing feed step are repeatedly executed to form the separation layers from the region on the one end side to the region on the other end side.

5. The manufacturing method of a single-crystal silicon substrate according to claim 1, wherein:
    the separation layer forming step is executed again after the separation layer forming step but before the indexing feed step.

6. The manufacturing method of a single-crystal silicon substrate according to claim 1, wherein:
    the separation layer is formed in such a manner that a width of the separation layer along the second direction becomes a predetermined length in the separation layer forming step, and the position inside the single-crystal silicon ingot at which the focal point is formed by irradiation with the laser beam is moved in such a manner that a movement distance along the second direction is equal to or longer than the predetermined length in the indexing feed step.

7. The manufacturing method of a single-crystal silicon substrate according to claim 1, further comprising:
a planarization step of grinding or polishing the front surface of the single-crystal silicon ingot to planarize the front surface before the holding step.

8. A manufacturing method of a single-crystal silicon substrate by which the single-crystal silicon substrate is manufactured from a single-crystal silicon ingot manufactured in such a manner that a crystal plane {100} is exposed in each of a front surface and a back surface, the manufacturing method comprising:
a holding step of holding the single-crystal silicon ingot whose side of the back surface is placed on a holding surface of a holding table by the holding table;
a separation layer forming step of irradiating the single-crystal silicon ingot with a laser beam with such a wavelength as to be transmitted through single-crystal silicon from a side of the front surface while moving a focal point of the laser beam and the single-crystal silicon ingot relative to each other along a first direction that is parallel to the holding surface and that forms an acute angle of equal to or smaller than 5° with a crystal orientation <100> of the single-crystal silicon ingot, in a state in which the focal point is positioned inside the single-crystal silicon ingot, to form a separation layer in a linear region along the first direction inside the single-crystal silicon ingot, wherein in the separation layer forming step, cracks extend along crystal planes that are crystal planes included in crystal planes {N10} (N is a natural number equal to or smaller than 10) and that are parallel to a crystal orientation that forms an acute angle of equal to or smaller than 5° with the first direction in crystal orientations <100> of the single-crystal silicon ingot;
an indexing feed step of moving a position inside the single-crystal silicon ingot at which the focal point is formed by irradiation with the laser beam when the separation layer forming step is executed again along a second direction that is parallel to the holding surface and is orthogonal to the first direction; and
a splitting-off step of splitting off the single-crystal silicon substrate from the single-crystal silicon ingot with use of the separation layers as a point of origin after repeatedly executing the separation layer forming step and the indexing feed step to form the separation layers from a region on one end side in the second direction inside the single-crystal silicon ingot to a region on the other end side.

* * * * *